United States Patent [19]
Buckfeller et al.

[11] Patent Number: 6,136,159
[45] Date of Patent: Oct. 24, 2000

[54] METHOD FOR DEPOSITING METAL

[75] Inventors: Joseph William Buckfeller, Orlando, Fla.; Sailesh Chittipeddi, Allentown, Pa.; Sailesh Mansinh Merchant, Orlando, Fla.

[73] Assignee: Lucent Technologies Inc., Murray Hill, N.J.

[21] Appl. No.: 09/276,086

[22] Filed: Nov. 6, 1998

Related U.S. Application Data

[62] Division of application No. 08/843,125, Apr. 25, 1997, Pat. No. 5,935,936, which is a division of application No. 08/706,932, Sep. 3, 1996, Pat. No. 5,807,760, which is a continuation of application No. 08/492,357, Jun. 19, 1995, abandoned, which is a continuation of application No. 08/197,654, Feb. 17, 1994, abandoned, which is a continuation of application No. 07/964,106, Oct. 20, 1992, abandoned, which is a continuation of application No. 07/629,925, Dec. 19, 1990, abandoned.

[51] Int. Cl.[7] ................................................. C23C 14/34
[52] U.S. Cl. .............................. 204/192.12; 204/192.17; 204/192.25; 204/298.09; 204/298.15; 438/584
[58] Field of Search ...................... 438/584; 204/192.17, 204/192.25, 192.12, 298.09, 298.15

[56] References Cited

U.S. PATENT DOCUMENTS

| | | |
|---|---|---|
| 1,954,950 | 4/1934 | Russell ............................... 204/298.09 |
| 4,275,289 | 6/1981 | Lord . |
| 4,361,749 | 11/1982 | Lord . |
| 4,495,221 | 1/1985 | Broadbent . |
| 4,512,391 | 4/1985 | Harra . |
| 4,743,570 | 5/1988 | Lamont, Jr. ......................... 204/298.09 |
| 4,816,126 | 3/1989 | Kamoshida et al. . |
| 4,837,183 | 6/1989 | Polito et al. . |
| 4,886,565 | 12/1989 | Koshiba et al. . |
| 4,891,112 | 1/1990 | Wong . |
| 4,903,754 | 2/1990 | Hirscher et al. . |
| 4,911,812 | 3/1990 | Kudo et al. . |
| 4,949,783 | 8/1990 | Lakios . |
| 4,970,176 | 11/1990 | Tracy et al. . |
| 5,108,951 | 4/1992 | Chen et al. . |
| 5,267,607 | 12/1993 | Wada . |

FOREIGN PATENT DOCUMENTS

| | | |
|---|---|---|
| 0 171 011 A3 | 2/1986 | European Pat. Off. ......... H01L 21/68 |
| 0 273 715 A2 | 7/1988 | European Pat. Off. ......... H01L 21/31 |
| 0 488 628 A2 | 6/1992 | European Pat. Off. ....... H01L 21/285 |
| 59-220915 | 12/1984 | Japan ................................. 204/298.09 |
| 2170649 | 8/1986 | United Kingdom ............ H01L 21/28 |

Primary Examiner—Rodney McDonald
Attorney, Agent, or Firm—Anthony Grillo

[57] ABSTRACT

A method of depositing aluminum or other metals so that vias are more completely filled is disclosed. The wafer or substrate is preheated to a temperature of approximately 200° C. Then the wafer is placed in an ambient of approximately 350° C. while metal deposition commences. The resulting metal layer has a gradually increasing grain size and exhibits improved via filling. Also disclosed is a method and apparatus (involving cooling of support structures) for deposition of an antireflective coating to prevent rainbowing or spiking of the coating into the underlying metal.

7 Claims, 2 Drawing Sheets

METHOD FOR DEPOSITING METAL

This is a divisional of application Ser. No. 08/843,125, filed on Apr. 25, 1997 now U.S. Pat. No. 5,935,936 which is a divisional application of Ser. No. 08/706,932, filed on Sep. 3, 1996 now U.S. Pat. No. 5,807,760 which is a continuation application of Ser. No. 08/492,357, filed on Jun. 19, 1995 now abandoned which is a continuation application of 08/197,654, filed Feb. 17, 1994 now abandoned which is a continuation application of Ser. No. 07/964,106, filed on Oct. 20, 1992 now abandoned which is a continuation application of Ser. No. 07/629,925, filed on Dec. 19, 1990 now abandoned entitled Method For Depositing Metal.

TECHNICAL FIELD

The present invention relates to the manufacture of integrated circuits, and more particularly to methods for forming metal layers during the course of integrated circuit fabrication.

BACKGROUND OF THE INVENTION

Conventional integrated circuits manufacturing frequently includes the formation of active devices such as transistors upon an appropriate substrate. The active devices are next covered with a dielectric material. Openings, often termed "windows" or "vias," are created in the dielectric. Next a conductive material, typically, a metal containing predominantly, for example, aluminum (and its alloys, such as those containing silicon and/or copper or both) is deposited in an argon atmosphere often by sputtering or physical wafer depostion, or tungsten by chemical wafer depostion, in a layer over the dielectric and within the opening.

An anti-reflective coating (ARC) (usually silicon) is deposited over the conductor to facilitate lithography. Then the conductor is subsequently patterned to form conductive runners between individual devices.

It is important that the anti-reflective coating thickness be maintained comparatively uniform so that spurious reflections are not created—thus interfering with subsequent lithography. It is also important that whatever conductive material is deposited, the opening be adequately filled to insure good electrical contact between the underlying device and the runner (and ultimately other devices in the circuit).

Aluminum is often used as a material for conductive runners. It has been found that the performance of aluminum runners in integrated circuits depends somewhat upon the conditions under which the aluminum runners are formed.

Various factors may affect the deposition of aluminum layers. Some of these factors are discussed below. In recent years, stress-induced voids have been reported as a major mode of failure for aluminum lines. Stress-induced voiding is due to tensile stresses generated in the aluminum lines during the cooling that follows deposition of an oxide or a nitride passivation layer. It has been found that increasing the metal deposition temperature helps to reduce problems associated with stress-induced voiding.

However, the higher deposition temperature can give rise to a new problem, namely the pull-back of deposited aluminum layers in vias and windows. The pull-back phenomenon (schematically illustrated in FIG. 1) is exacerbated as the deposition temperature is increased.

As mentioned before, after the aluminum is deposited, an ARC is formed upon the upper surface of the aluminum. The ARC is generally boron-doped amorphous silicon. Should the aluminum/ARC combination be heated, the silicon ARC tends to migrate into the aluminum. Consequently, the thickness of the ARC changes. The change in thickness of the ARC is evidenced by "rainbowing," i.e., multicolored reflections emanating from the variable thickness silicon ARC. However, maintenance of a relatively constant ARC is important to the success of the following lithography steps in achieving uniform linewidths.

SUMMARY OF THE INVENTION

The present invention helps to address both the via-filling problem and the rainbowing-spiking problem. The present invention helps to insure adequate via filling without exacerbating stress-induced voiding. Illustratively, the invention includes an integrated circuit with a dielectric layer having an opening. The opening is substantially filled with a metal which has a grain size that gradually increases through the opening.

Another illustrative embodiment includes a fabrication method for depositing a metal which includes preheating a substrate to a first temperature and then exposing the substrate to an ambient environment at a second higher temperature and depositing the metal as the temperature of the substrate rises toward the second temperature. The illustrative process permits the formation of a metal with a gradually increasing grain size. Metal thus deposited in a via will tend to adequately fill the via and not tend to exhibit pull-back.

Concerning the rainbowing problem in the ARC, the present invention helps to prevent rainbowing by providing a support structure maintained at a constant temperature during deposition of the ARC.

DETAILED DESCRIPTION

Figure 1:
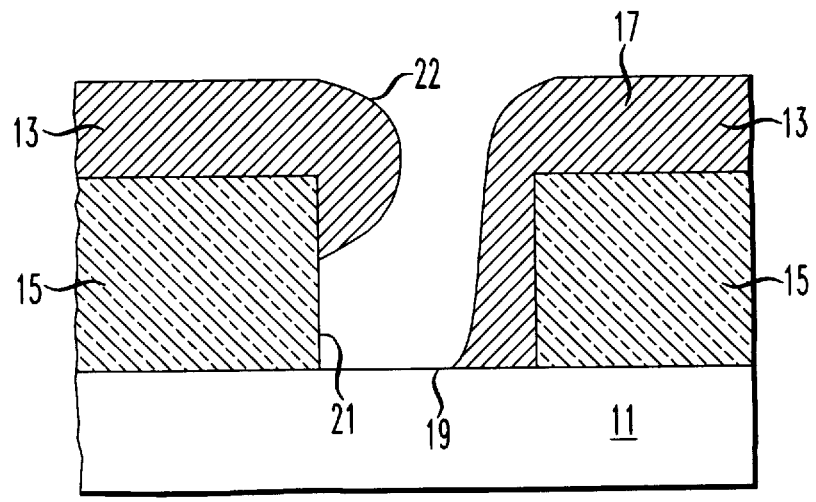
FIGS. 1 and 2 are cross-sectional views depicting the advantages of an illustrative embodiment of the present invention.

An illustration of the pull-back phenomenon is provided in FIG. 1. Reference numeral 11 denotes a substrate which, illustratively, may be silicon, or epitaxial silicon, with or without dopants. (Reference numeral 11 may also denote a conductive runner.) Dielectric 15 generally covers substrate 11. Opening 17, which may be a via or window, exists in dielectric 15. Conductive layer 13, which may be illustratively aluminum, or a mixture of aluminum with copper and/or silicon added, has been deposited upon dielectric 15. It is desired that conductor 13 fill via or window 17. However, as can be seen from the figure, the as-deposited conductive film 13 does not completely fill via or window 17. A portion 21 of dielectric 15 together with a portion 19 of substrate 11 is not covered by conductive layer 13. The pull-back phenomenon prevents the formation of good electrical contact between runners formed from conductive layer 13 and substrate 11.

It is known that the grain size of aluminum (and other metals) increases with increasing temperature. As the temperature at which the aluminum is deposited increases, the initial nuclei tend to be large. If the nuclei coalesce near the top of the vias or windows such as 17, they may tend to shadow the walls and prevent further deposition. In FIG. 1, coalescence of large nuclei near the point designated by reference numeral 22 may inhibit conductor coverage on surfaces 19 and 21. The incomplete filling is termed "pullback." The publication, Pramanik et al., Aluminum Metallization for ULSI, Solid State Technology, pp. 73–79, March 1990, suggests that the pull-back problem may be solved by two-step deposition procedure in which a thin nucleating layer of aluminum is first deposited at a low temperature and then the remainder of the film is deposited at a higher temperature. However, applicants' investigations have shown that when a two-step deposition process is employed, the pull-back problem still persists. It should be noted that the Pramanik et al. technique requires that the substrate be brought into thermal equilibrium with its environment at a fixed first temperature after which a first deposition step is performed. Then the wafer is brought into thermal equilibrium with a second, higher temperature, environment and a second deposition performed. Two discrete deposition steps are performed after the wafer has twice attained thermal equilibrium with its environment.

Applicants have discovered that the pull-back problem may be alleviated by depositing metal continuously as the wafer temperature rises, approaching a second thermal equilibrium with its environment. The continuous deposition, formed as the wafer temperature rises, provides a metallic layer in which the grain size increases very gradually, thus, helping to prevent pull-back and improving film quality.

The inventive process may be practiced in a sputter-deposition apparatus, such as the models 3180 and 3190 manufactured by Varian Associates, Inc. Other apparatus such as physical vapor deposition apparatus may also be used. Initially the wafer is subjected to an ambient environment at a temperature of between 150° C. and 200° C., with approximately 200° C. being preferable. The wafer is allowed to come into thermal equilibrium with the ambient. In a single-chamber multi-station Varian machine, the preheating may be accomplished in one of three stations. Next, the wafer is transferred (without breaking vacuum) to another station in which the heater temperature is between 350° C. and 400° C., preferably approximately 350° C. The wafer is not allowed to come to thermal equilibrium with the heater. Instead, sputter deposition of aluminum and/or aluminum alloys containing silicon and/or copper or both (typically approximately 0–2% silicon and 0–4% copper) is begun. After approximately 50 seconds, a layer of approximately 10000 Å is deposited. If longer deposition times are used, thicker layers will result. As the temperature of the wafer rises to approach the temperature of the ambient environment, the average grain size of the deposited aluminum tends to become larger. The initially small grain size tends to produce a layer which covers the exposed surfaces of dielectric 15 in FIG. 1 including surfaces 21 and 19. The subsequently formed larger grain sizes complete filling of the opening 17 thus, producing a filled via somewhat similar to that depicted in FIG. 2. The resulting film exhibits improved via filling and satisfactory resistance to stress-induced voiding.

Should it be desired, a layer of titanium, titanium nitride, or tungsten may be deposited prior to the aluminum deposition. Deposition of these other materials may be accomplished at a low temperature. Thus the "preheating" step described above, may be advantageously used, if desired, to deposit an additional metallic layer beneath the aluminum layer.

The inventive technique may be applied to all metals which are formed by sputtering or chemical vapor deposition, such as aluminum, tungsten, molybdenum, and copper, together with composites rich in these materials.

The inventive technique is applicable to multi-chambered deposition apparatus such as a cluster tool also. It is necessary to provide for the ramped heating of the wafer in the deposition chamber.

Turning to the rainbowing problem, applicants have noted that during production processing, when a silicon ARC is sputter-deposited upon an aluminum layer, that the silicon may migrate into the aluminum, thus causing the rainbowing phenomenon mentioned before. Rainbowing or migration may not occur on the first few wafers of a production lot. However, rainbowing or migration are often observed after several wafers have been processed. The reason for the occurrence is that the wafer support apparatus is heated during the sputter deposition process. The first wafers which undergo processing in a comparatively cold machine do not exhibit rainbowing. As the wafer support apparatus heats up during sputter deposition upon several wafers, heat is transferred to subsequent wafers, thus inducing rainbowing or spiking.

Figure 3:
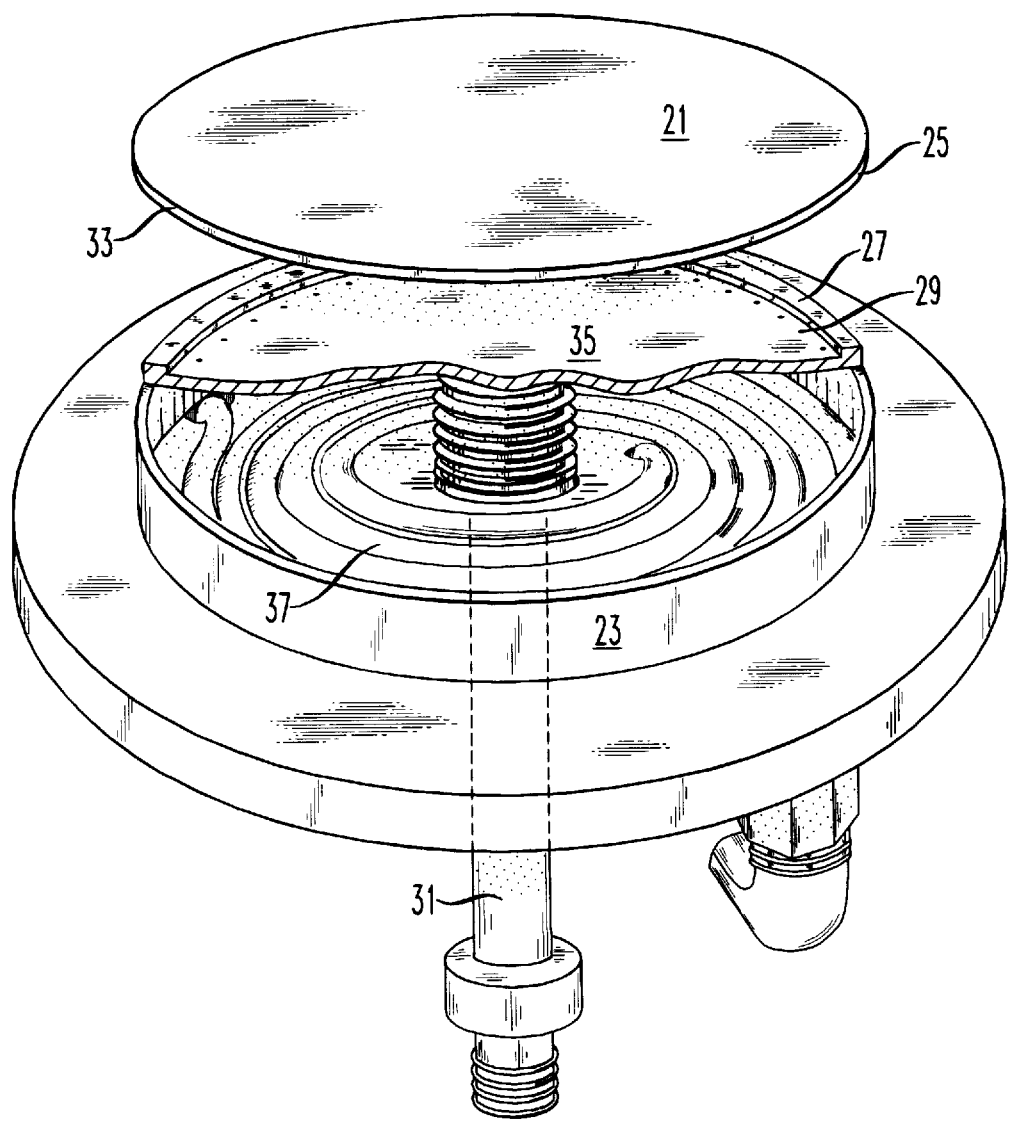
FIG. 3 is a partial perspective, partial cross-sectional view of another illustrative embodiment of the present invention.

Depicted in FIG. 3 is a portion of the apparatus commonly used to support a wafer during deposition of materials such as by sputtering. Wafer 21 is supported above block 23 by a ring and clips not shown. However, outer edge 25 of wafer 21 contacts lip 27 of block 23.

An inert gas such as argon flows through holes 29 and contacts most of the under side of wafer 21. The gas, which may be heated, flows in through pipe 31 whence it is ducted by capillaries (not illustrated) to holes 29. Since the gas is admitted only through holes 29 near the edge of the wafer 21, thermal gradients can be created across the wafer. The existence of thermal gradients means that there may exist favorable conditions for deposition on one portion of the wafer and less favorable deposition conditions on another part of the wafer.

Furthermore, a thermal convection process frequently occurs involving the under side 33 of wafer 21, the inert gas, and the upper surface 35 of block 23. (Recall, as mentioned before, that the upper surface 35 of block 23 does not contact the under side 33 of wafer 21.)

Figure 2:
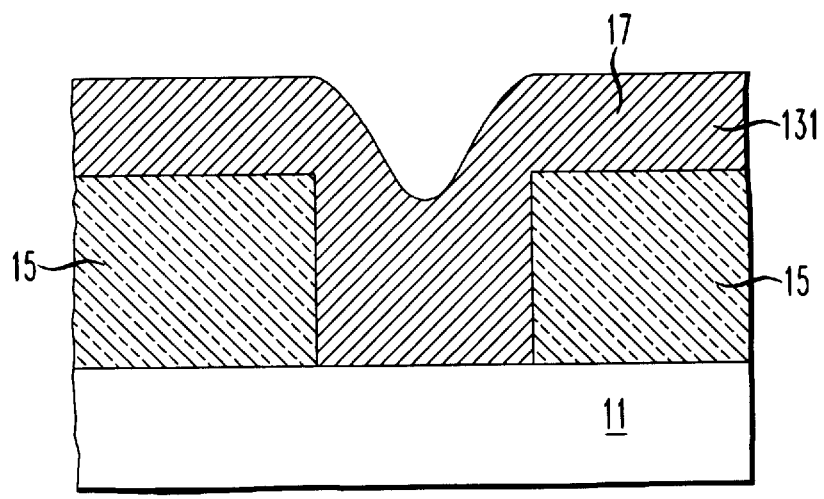

The thermal convection process mentioned above becomes particularly important, for example, after the deposition of aluminum such as layer 17 in FIG. 2 during the sputter deposition of an anti-reflective coating, which is, typically, boron doped amorphous silicon.

During the production of integrated circuits, a steady stream of wafers is placed into an apparatus such as that shown in FIG. 3 for ARC on aluminum. Inevitably the temperature of block 23 rises. Consequently, wafers which are processed first experience a temperature environment which is lower than wafers processed an hour or so later. These later-processed wafers experience a higher temperature because of convection between the hot block 23 and the underside 33 of the wafer.

The increased temperature of the block may induce thermal gradients in the wafer which may affect aluminum deposition, as mentioned before. The increased temperature of the wafer causes the ARC to migrate into the underlying aluminum.

While some practitioners employ a separate cooling step before ARC deposition, the separate cooling step is ineffective in alleviating the problem of block-heating induced temperature increases during ARC deposition.

Applicants have solved the problem of block heating by incorporating a cooling coil 37 within block 23 and in proximity to surface 35 of block 23. The coil (through which a variety of gaseous and liquid coolants including water may be flowed) helps to maintain the temperature of surface 35 relatively constant even during long production runs in which it is continually exposed to the heat generated by sputtering processes. The maintenance of a relatively constant temperature on surface 35 helps to:

a.) improve the previously-discussed aluminum deposition process by reducing or eliminating thermal gradients across wafer 21 and helping to insure a constant temperature for all wafers;

b.) improve the subsequent deposition of anti-reflective coatings by insuring that each wafer in the production lot sees the same temperature, thus helping to eliminate silicon migration and rainbowing.

What is claimed is:

1. A method of manufacturing an integrated circuit comprising the steps of:

providing an apparatus for sputter deposition of materials upon a substrate, the apparatus including:

(a) a block for supporting said substrate, said block having:

a raised edge surrounding a flat portion, said raised edge providing support for the periphery of said substrate, there being a space between said flat portion and said substrate, and a base, said flat portion and said base forming a chamber; and (b) a tube disposed in the chamber, said tube cooling the block and containing a fluid coolant, said tube being proximate to said flat portion of said block.

2. The method according to claim 1 further comprising the step of providing the tube in the shape of a coil.

3. A method for manufacturing an integrated circuit comprising the steps of:

providing an apparatus for sputter deposition of materials upon a substrate, the apparatus including:

a block for supporting said substrate, said block having a raised edge surrounding a flat portion, said raised edge providing support for the periphery of said substrate, there being a space between said flat portion and said substrate; a chamber in the block and, a cooling coil in the chamber that cools the block, the cooling coil containing a fluid coolant, said cooling coil being proximate to said flat portion of said block; and sputter depositing the materials on the substrate.

4. A method of manufacturing an integrated circuit comprising the steps of:

providing an apparatus for sputter deposition of materials upon a substrate, the apparatus including:

(a) a block for supporting said substrate, said block having a chamber; and (b) a tube disposed in the chamber, said tube cooling the block and containing a coolant.

5. A method of manufacturing an integrated circuit comprising the steps of:

(a) providing an apparatus for sputter deposition of materials upon a substrate;

(b) providing a block for supporting a substrate in the apparatus, the block having a chamber;

(c) providing a tube disposed in the chamber; and (d) cooling the substrate by circulating a coolant through the tube.

6. The method according to claim 5 further comprising the step of providing the tube in the shape of a coil.

7. The method according to claim 5 wherein at least two of the steps (a), (b), (c), and (d) occur concurrently.

* * * * *